(12) United States Patent
Li

(10) Patent No.: US 11,201,161 B2
(45) Date of Patent: Dec. 14, 2021

(54) EFUSE MEMORY CELL, EFUSE MEMORY ARRAY AND USING METHOD THEREOF, AND EFUSE SYSTEM

(71) Applicants: Semiconductor Manufacturing International (Shanghai) Corporation, Shanghai (CN); Semiconductor Manufacturing International (Beijing) Corporation, Beijing (CN)

(72) Inventor: Xiaohua Li, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 17/101,246

(22) Filed: Nov. 23, 2020

(65) Prior Publication Data

US 2021/0272971 A1 Sep. 2, 2021

(30) Foreign Application Priority Data

Feb. 28, 2020 (CN) .......................... 202010130434.9

(51) Int. Cl.
*G11C 16/24* (2006.01)
*H01L 27/112* (2006.01)
(Continued)

(52) U.S. Cl.
CPC ........ *H01L 27/11206* (2013.01); *G11C 16/08* (2013.01); *G11C 16/24* (2013.01); *G11C 17/165* (2013.01); *H01L 23/5256* (2013.01)

(58) Field of Classification Search
CPC ........ G11C 17/165; G11C 16/24; G11C 16/08
(Continued)

(56) References Cited

U.S. PATENT DOCUMENTS 5,058,059 A * 10/1991 Matsuo ................ G11C 29/832
365/96
5,359,560 A * 10/1994 Suh ...................... G11C 29/808
365/200

(Continued)

*Primary Examiner* — Michael T Tran
(74) *Attorney, Agent, or Firm* — Crowell and Moring LLP

(57) ABSTRACT

An eFuse memory cell, an eFuse memory array and a using method thereof, and an eFuse system are provided. In one form, an eFuse memory cell includes: a programming transistor, where a source of the programming transistor is grounded; a first electric fuse having a first terminal and a second terminal opposite to the first terminal, where the first terminal is connected to a drain of the programming transistor; one or more second electric fuses connected in parallel to each other, where each of the second electric fuses is connected in parallel with the first electric fuse, the second electric fuse has a third terminal and a fourth terminal opposite to the third terminal, and the third terminal is connected to the drain of the programming transistor; a word line connected to a gate of the programming transistor; a first programming bit line connected to the second terminal of the first electric fuse; and one or more second programming bit lines in a one-to-one correspondence with the second electric fuses, the second programming bit line being connected to the fourth terminal of the corresponding second electric fuse. The eFuse memory cell provided in the present disclosure has an opportunity to be programmed at least twice, thereby improving a yield rate of the eFuse memory array.

19 Claims, 3 Drawing Sheets

(51) Int. Cl.
*G11C 17/16* (2006.01)
*H01L 23/525* (2006.01)
*G11C 16/08* (2006.01)

(58) Field of Classification Search
USPC .................................................. 365/96, 100
See application file for complete search history.

(56) References Cited

U.S. PATENT DOCUMENTS

| | | | | |
|---|---|---|---|---|
| 5,657,279 | A * | 8/1997 | Savignac | G11C 29/812 |
| | | | | 365/200 |
| 7,817,455 | B2 * | 10/2010 | Fredeman | G11C 29/027 |
| | | | | 365/96 |
| 10,693,460 | B1 * | 6/2020 | Takahashi | G11C 11/4093 |
| 10,853,542 | B1 * | 12/2020 | Sengupta | G06F 30/34 |
| 2009/0065761 | A1 * | 3/2009 | Chen | H01L 45/144 |
| | | | | 257/5 |
| 2013/0039117 | A1 * | 2/2013 | Lin | G11C 17/18 |
| | | | | 365/96 |
| 2014/0253220 | A1 * | 9/2014 | Kirihata | G11C 17/18 |
| | | | | 327/525 |
| 2015/0348960 | A1 * | 12/2015 | Gauthier, Jr. | H01L 23/5256 |
| | | | | 361/56 |
| 2016/0035434 | A1 * | 2/2016 | Huang | G11C 17/18 |
| | | | | 365/96 |
| 2016/0035439 | A1 * | 2/2016 | Huang | G11C 29/78 |
| | | | | 365/96 |
| 2017/0186495 | A1 * | 6/2017 | Yang | G11C 17/18 |
| 2017/0345827 | A1 * | 11/2017 | Chang | G11C 17/16 |
| 2020/0058361 | A1 * | 2/2020 | Chang | H01L 27/11206 |
| 2021/0125678 | A1 * | 4/2021 | Cho | H01L 23/5252 |

* cited by examiner

EFUSE MEMORY CELL, EFUSE MEMORY ARRAY AND USING METHOD THEREOF, AND EFUSE SYSTEM

RELATED APPLICATIONS

The present application claims priority to Chinese Patent Appln. No. 202010130434.9, filed on Feb. 28, 2020, the entire disclosure of which is hereby incorporated by reference.

BACKGROUND

Technical Field

Embodiments and implementations of the present disclosure relate to the field of semiconductor manufacturing, and in particular, to an eFuse memory cell, an eFuse memory array and a using method thereof, and an eFuse system.

Related Art

EFuse (electrically programmable fuse) technology, a one-time programming storage technology widely used in a semiconductor chip, may be used to record configuration information of the semiconductor chip or to repair an inevitable bad element generated in an integrated circuit due to a semiconductor process. When the semiconductor chip fails, an eFuse circuit in the semiconductor chip may repair a semiconductor chip defect. When the semiconductor chip runs incorrectly, the eFuse circuit may automatically correct the semiconductor chip, thereby improving a yield rate of the semiconductor chip.

An eFuse circuit is typically characterized in that a default stored bit is logical "0". A required bit may be written from logical "0" to logical "1" through programming. Once the bit is written as logical "1", the bit cannot be written as logical "0" any more. However, a bit that is not written as logical "0" may also be written as logical "1" through programming.

In an existing eFuse technology, a metal electric fuse is usually used, that is, it is controlled whether the electric fuse is fused through a current in a control circuit, to complete a programming operation of writing from logical "0" to logical "1".

SUMMARY

Embodiments and implementations of the present disclosure are to provide an eFuse memory cell, an eFuse memory array and a using method thereof, and an eFuse system, so that a yield rate of the eFuse memory array is improved.

To address the foregoing problem, one form of the present disclosure provides an eFuse memory cell, including: a programming transistor, where a source of the programming transistor is grounded; a first electric fuse having a first terminal and a second terminal opposite to the first terminal, where the first terminal of the first electric fuse is connected to a drain of the programming transistor; one or more second electric fuses connected in parallel to each other, where each of the second electric fuses is connected in parallel with the first electric fuse, the second electric fuse has a third terminal and a fourth terminal opposite to the third terminal, and the third terminal of the second electric fuse is connected to the drain of the programming transistor; a word line connected to a gate of the programming transistor; one or more first programming bit lines, the second programming bit lines being in a one-to-one correspondence with the second electric fuses, where the second programming bit lines are connected to the second terminal of the corresponding first electric fuses; and a second programming bit line connected to the fourth terminal of the second electric fuse.

Another form of the present disclosure further provides an eFuse memory array, including: a plurality of eFuse memory cells arranged in a matrix, where each of the eFuse memory cells comprises a programming transistor, a first electric fuse, and one or more second electric fuses connected in parallel, where a source of the programming transistor is grounded; the first electric fuse having a first terminal and a second terminal opposite to the first terminal, where the first terminal of the first electric fuse is connected to a drain of the programming transistor, and the second electric fuse is connected in parallel with the first electric fuse; and the second electric fuse having a third terminal and a fourth terminal opposite to the third terminal, where the third terminal of the second electric fuse is connected to a drain of the programming transistor; a plurality of word lines, where each of the word lines is correspondingly connected to a gate of the programming transistor in a same row in the matrix; a plurality of first programming bit lines, where each of the first programming bit lines is correspondingly connected to a second terminal of the first electric fuse in a same column in the matrix; and a plurality of second programming bit lines, where each of the second programming bit lines is correspondingly connected to a fourth terminal of the second electric fuse in a same column in the matrix, and when there is a plurality of second electric fuses in each of the eFuse memory cells, where the second programming bit lines are in a one-to-one correspondence with the second electric fuses.

Another form of the present disclosure further provides a using method of the foregoing eFuse memory array, including: applying a turn-on voltage to any of the plurality of word lines to turn on the programming transistor; applying a first programming voltage to the first programming bit line corresponding to any of the eFuse memory cells; after the turn-on voltage is applied to any of the plurality of word lines, and the first programming voltage is applied to the first programming bit line corresponding to any of the eFuse memory cells, determining whether the first electric fuse is programmed; and when the first electric fuse is programmed, completing a programming operation on the corresponding eFuse memory cell; or when the first electric fuse is not programmed, sequentially applying a second programming voltage to the second programming bit lines corresponding to a same eFuse memory cell; and after the second programming voltage is applied to the second programming bit lines corresponding to the same eFuse memory cell, determining whether the corresponding second electric fuse is programmed.

A further form of the present disclosure provides a using method of an eFuse memory array, including: applying a turn-on voltage to any of the plurality of word lines to turn on the programming transistor; simultaneously applying a second programming voltage and a first programming voltage to the first programming bit line and the second programming bit line corresponding to any of the eFuse memory cells, respectively; after the turn-on voltage is applied to any of the plurality of word lines, and the second programming voltage and the first programming voltage are simultaneously applied to the first programming bit line and the second programming bit line corresponding to any of the eFuse memory cells, respectively, simultaneously determining whether the first electric fuse and the second electric fuse are programmed; and when at least one of the first electric fuse and the second electric fuse is programmed, completing a programming operation on the corresponding eFuse memory cell.

The present disclosure further provides an eFuse system including the foregoing eFuse memory array.

Compared with the prior art, technical solutions of embodiments and implementations of the present disclosure have the following advantages:

The eFuse memory cell (bit cell) provided according to embodiments and implementations of the present disclosure includes a first electric fuse and one or more second electric fuses connected in parallel, where the second electric fuses are connected in parallel with the first electric fuse. Therefore, if the first electric fuse fails to be programmed, the one or more second electric fuses may still be programmed. That is, each eFuse memory cell has an opportunity to be programmed at least twice, thereby improving a yield rate of the eFuse memory cell. Because the eFuse memory array includes a plurality of eFuse memory cells arranged in a matrix, a yield rate of the eFuse memory array is correspondingly improved.

DETAILED DESCRIPTION

An eFuse memory array includes a plurality of eFuse memory cells arranged in a matrix. At present, a yield rate of the eFuse memory array needs to be improved. A reason is analyzed below in combination with a schematic diagram of a circuit structure of an eFuse memory cell.

Figure 1:
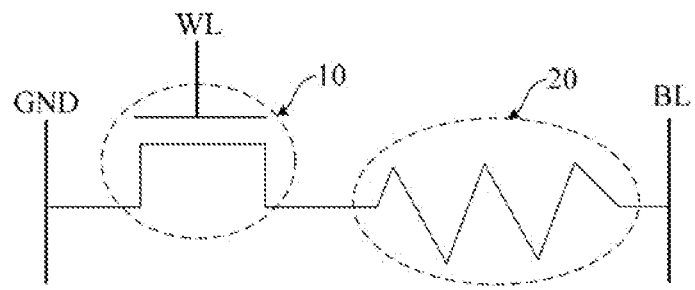
FIG. 1 is a schematic diagram of a circuit structure of an eFuse memory cell.

FIG. 1 is a schematic diagram of a circuit structure of an eFuse memory cell.

The eFuse memory cell includes: a programming transistor 10, where a source of the programming transistor 10 is grounded (GND); an electric fuse 20 having a first terminal (not labeled) and a second terminal (not labeled) opposite to the first terminal, where the first terminal of the electric fuse 20 is connected to a drain of the programming transistor 10; a word line (WL) connected to a gate of the programming transistor 10; and a bit line (BL) connected to the second terminal of the electric fuse 20.

When the eFuse memory cell is programmed, a programming voltage Vpp is applied to the second terminal of the electric fuse 20 (that is, an anode of the electric fuse 20) through the bit line (BL). Afterwards, a word line (WL) of any row in the eFuse memory array is set to a high level, so that the programming transistor 10 is turned on. A physical structure of the electric fuse 20 is changed through a thermal rupture or an electro migration (EM) phenomenon, so that the electric fuse 20 is fused, thereby causing the electric fuse 20 to change from a low-impedance state before being programmed to a high-impedance state, thereby further programming the eFuse memory cell.

However, a fusing current of the electric fuse 20 is related to a plurality of parameters (such as a melting point of the electric fuse 20, a room temperature, quality of the electric fuse, and a specific heat capacity of the electric fuse, etc.), and a fusing current of the electric fuse 20 is different in different environments. Therefore, at present, it is difficult to ensure that each eFuse memory cell may be programmed using the electric fuse fusing method for programming control, thereby resulting in a certain percentage of a defective rate in the eFuse memory array, and a difficulty in ensuring a yield rate of the eFuse memory array.

To address foregoing technical problems, embodiments and implementations of the present disclosure provide an eFuse memory cell, including: a programming transistor, where a source of the programming transistor being grounded; a first electric fuse having a first terminal and a second terminal that is opposite to the first terminal, where the first terminal of the first electric fuse is connected to a drain of the programming transistor; one or more second electric fuses are connected in parallel, where the second electric fuse is connected in parallel with the first electric fuse, the second electric fuse has a third terminal and a fourth terminal that is opposite to the third terminal, and the third terminal of the second electric fuse is connected to the drain of the programming transistor; a word line connected to a gate of the programming transistor; a first programming bit line connected to the second terminal of the first electric fuse; and one or more second programming bit lines, where the second programming bit lines are in a one-to-one correspondence with the second electric fuses, and each second programming bit line is connected to the fourth terminal of the corresponding second electric fuse. If the first electric fuse fails to be programmed, the second electric fuse may still be programmed, that is, each eFuse memory cell has an opportunity to be programmed at least twice, thereby improving a yield rate of the eFuse memory cell. Because the eFuse memory array includes a plurality of eFuse memory cells arranged in a matrix, a yield rate of the eFuse memory array is correspondingly improved.

In order to make the foregoing objectives, features, and advantages of the embodiments and implementations of the present disclosure more apparent and easier to understand, specific embodiments and implementations the present disclosure are described in detail below with reference to the accompanying drawings.

Figure 2:
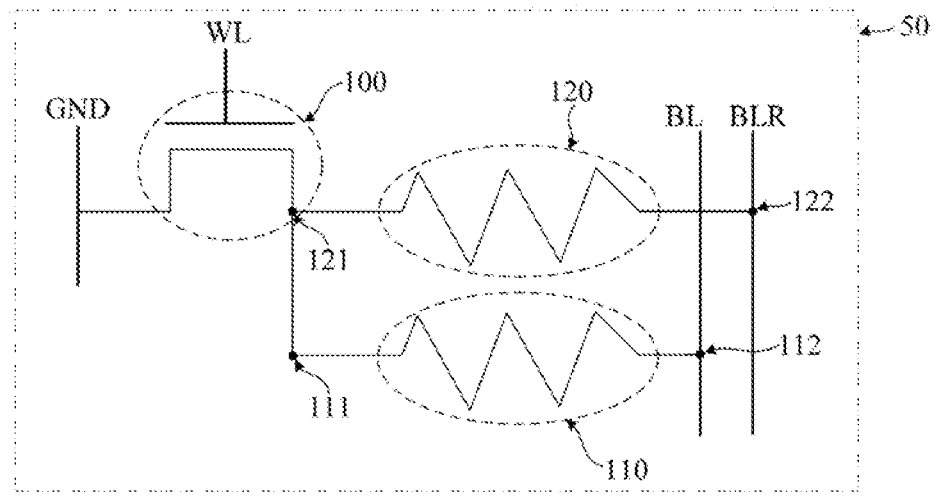
FIG. 2 is a schematic diagram of a circuit structure of one form of an eFuse memory cell according to the present disclosure.

FIG. 2 is a schematic diagram of a circuit structure of one form of an eFuse memory cell according to the present disclosure.

Referring to FIG. 2, an eFuse memory cell 50 includes: a programming transistor 100, where a source of the programming transistor 100 being grounded (GND); a first electric fuse 110, where the first electric fuse 110 has a first terminal 111 and a second terminal 112 that is opposite to the first terminal 111, the first terminal 111 of the first electric fuse 110 is connected to a drain of the programming transistor 100; one or more second electric fuses 120 are connected in parallel, where the second electric fuse 120 is connected in parallel with the first electric fuse 110, the second electric fuse 120 has a third terminal 121 and a fourth terminal 122 that is opposite to the third terminal 121, the third terminal 121 of the second electric fuse 120 being connected to the drain of the programming transistor 100; a word line (WL)

connected to a gate of the programming transistor 100; and a first programming bit line (BL) connected to the second terminal 112 of the first electric fuse 110; and one or more second programming bit lines (BLR), where the second programming bit lines are in a one-to-one correspondence with the second electric fuses, and the second programming bit lines are connected to the fourth terminal 122 of the corresponding second electric fuses 120.

The eFuse memory cell 50 includes a first electric fuse 110 and one or more second electric fuses 120 connected in parallel, the second electric fuse 120 being connected in parallel with the first electric fuse 110. Therefore, if the first electric fuse 110 fails to be programmed, the second electric fuse may still be programmed, that is, each eFuse memory cell 50 has an opportunity to be programmed at least twice, thereby improving a yield rate of the eFuse memory cell. Because the eFuse memory array includes a plurality of eFuse memory cells 50 arranged in a matrix, a yield rate of the eFuse memory array is correspondingly improved.

Implementations of the eFuse memory cell are described below with reference to the drawings.

The programming transistor 100 is configured to generate a programming control signal for controlling an operation state of the eFuse memory cell 50 to control a programming state of the eFuse memory cell 50.

In particular, the programming transistor 100 is adapted to generate an input signal for controlling the eFuse memory cell 50 to get into the programming state. When a valid potential (valid high potential or low potential) is applied to a gate of the programming transistor 100, the programming transistor 100 is turned on, so that the eFuse memory cell 50 is programmed.

Therefore, the programming transistor 100 is in a one-to-one correspondence with the eFuse memory cell 50, that is, in the eFuse memory array, a number of the programming transistor 100 is equal to a number of the eFuse memory cell 50.

In some implementations, the programming transistor 100 is an NMOS transistor. With a same size, compared to a PMOS transistor, a saturation current (Idsat) of the NMOS transistor is relatively large. Therefore, a larger programming current may be generated, to achieve fusing of the first electric fuse 110 or the second electric fuse 120, so that programming efficiency of the eFuse memory cell 50 is improved.

Correspondingly, when the high potential is applied to the gate of the programming transistor 100, the programming transistor 100 is turned on.

In some implementations, according to actual requirements, the programming transistor may also be a PMOS transistor. Correspondingly, when the low potential is applied to the gate of the programming transistor, the programming transistor is turned on. Correspondingly, in order to cause the programming transistor to be turned on, the source of the programming transistor is grounded.

The word line (WL) is connected to the gate of the programming transistor 100, and the word line (WL) is a signal line that controls a programming operation.

In particular, the eFuse memory array includes a plurality of the eFuse memory cells 50 arranged in a matrix, and the word line (WL) is configured to determine a row address of a to-be-programmed eFuse memory cell 50 in the array, and is further configured to turn on the programming transistor 100 of the eFuse memory cell 50 corresponding to the address, so that the to-be-programmed eFuse bit cell 50 is programmed.

The first electric fuse 110 has a first terminal 111 and a second terminal 112 opposite to the first terminal 111. The first terminal 111 of the first electric fuse 110 is connected to a drain of the programming transistor 100.

In some implementations, the first terminal 111 and the second terminal 112 are two bonding pads of the first electric fuse 110. The first terminal 111 is an anode of the first electric fuse 110, and the second terminal 112 is a cathode of the first electric fuse 110. In the first electric fuse 110, a part between the first terminal 111 and the second terminal 112 is generally referred to as a fuse-link.

When the first electric fuse 110 gets into a programming state, a programming current flows through the first electric fuse 110 and the programming transistor 100 in sequence to the ground at a source of the programming transistor 100, and the programming current destroys (fuses) the fuse-link, thereby changing a resistance of the first electric fuse 110.

The second electric fuse 120 is connected in parallel with the first electric fuse 110, and the second electric fuse 120 is used as a redundant electric fuse of the first electric fuse 110.

In some implementations, materials, structures and sizes of the second electric fuse 120 and the first electric fuse 110 are the same.

The third terminal 121 of the second electric fuse 120 is connected to the drain of the programming transistor 100. Therefore, when the second electric fuse 120 is programmed, a programming current flows through the second electric fuse 120 and the programming transistor 100 in sequence to the ground at the source of the programming transistor 100.

As the number of the second electric fuses 120 connected in parallel is increasingly larger, the eFuse memory cell 50 has more opportunities to be programmed. However, when there is a plurality of the second electric fuses 120, the plurality of second electric fuses 120 are stacked. As the number of the second electric fuses 120 connected in parallel is increasingly larger, an eFuse IP (intellectual property) core has an excessively large thickness correspondingly. Accordingly, in some implementations, there is one second electric fuse 120. That is to say, the eFuse memory cell 50 includes one first electric fuse 110 and one second electric fuse 120, to facilitate design of a peripheral circuit corresponding to the eFuse memory array, thereby preventing an excessively large thickness of the eFuse IP core.

For a description of the second electric fuse 120, reference may be made to a related description of the first electric fuse 110 described above, as the details are not described herein again.

In some implementations, materials of the first electric fuse 110 and the second electric fuse 120 are metal materials, that is, the first electric fuse 110 and the second electric fuse 120 are both metal electric fuses.

The metal electric fuse has a relatively low initial resistance. When the metal electric fuse is not programmed, a resistance value of the metal electric fuse is very small, for example, 5Ω to 200Ω. When a relatively large programming current flows through the metal electric fuse and causes the metal electric fuse to be fused, the resistance value of the metal electric fuse doubles, for example, 1 KΩ to 100 KΩ. In the eFuse memory array, the fused metal electric fuse is permanently in a turned-off state, while an unfused metal electric fuse remains in a turned-on state.

Therefore, data stored in the eFuse memory array is known by determining whether the metal electric fuse is fused. Generally, a read circuit commonly used in the field of electrical memory may be used to read a state of the metal electric fuse (that is, whether an eFuse memory cell corresponding to the metal electric fuse is programmed).

In addition, through the metal electric fuse, the first electric fuse 110 and the second electric fuse 120 may be formed by using a back end of line (BEOL) manufacturing procedure, and the first electric fuse 110 and the second electric fuse 120 are easily in a stacked state, helping to prevent a too large planar size of the eFuse memory cell 50. For example, compared to an eFuse memory cell having a single electric fuse, a size of the eFuse memory cell 50 in some implementations remains unchanged in the horizontal plane, so that an area of the eFuse memory array remains unchanged in the chip.

In addition, a metal electric fuse is selected to improve compatibility of a process of forming the electric fuse with a CMOS manufacturing process, without increase of an additional process step and process costs.

In particular, the metal material is copper. An initial resistance value of copper is very small, and selection of copper causes the process of forming the metal electric fuse to be compatible with the back end of line (BEOL) manufacturing processes.

In particular, the first electric fuse 110 and the second electric fuse 120 are two metal interconnection layers isolated along a stacking direction, so that the first electric fuse 110 and the second electric fuse 120 are connected in parallel. Simultaneously, in the case that it is guaranteed that each eFuse memory cell 50 has an opportunity to be programmed twice, the size of the eFuse memory cell 50 remains unchanged in the horizontal plane, so that the area of the eFuse memory array remains unchanged in the chip.

In some implementations, projections of the two metal interconnection layers in the horizontal plane are parallel to each other.

The first electric fuse 110 and the second electric fuse 120 are two metal interconnection layers isolated along a stacking direction, that is, the first electric fuse 110 and the second electric fuse 120 are different metal interconnection layers. Therefore, when projections of the two metal interconnection layers in the horizontal plane are parallel to each other, the first terminal 111 of the first electric fuse 110 and the third terminal 121 of the second electric fuse 120 are both easily connected to a drain of the programming transistor 100, reducing complexity of circuit design and preventing the size of the eFuse memory cell 50 in the horizontal plane from being increased.

In circuit design, projections of two adjacent metal interconnection layers in the horizontal plane intersect with each other perpendicularly, while projections of odd metal interconnection layers in the horizontal plane are parallel to each other, and projections of even metal interconnection layers in the horizontal plane are also parallel to each other. Therefore, in some implementations, the metal interconnection layers corresponding to the first electric fuse 110 and the metal interconnection layers corresponding to the second electric fuse 120 are both odd metal interconnection layers or are both even metal interconnection layers.

In some implementations, either of the first electric fuse 110 and the second electric fuse 120 is one of a first metal interconnection layer to a fourth metal interconnection layer.

In the back end of line (BEOL) manufacturing procedure, a metal interconnection structure generally includes a plurality of stacked metal interconnection layers. Either of the first electric fuse 110 and the second electric fuse 120 is one of the first metal interconnection layer to the fourth metal interconnection layer, to facilitate design of the peripheral circuit corresponding to the eFuse memory array. For example, other metal interconnection layers located above the fourth metal interconnection layer are used to design the peripheral circuit, preventing an excessively large thickness of the eFuse IP (intellectual property) core.

In addition, the first metal interconnection layer to the fourth metal interconnection layer are inter-layer metal interconnection layers, and forming processes of the first metal interconnection layer to the fourth metal interconnection layer are usually the same, so that a process difficulty in manufacturing the semiconductor is reduced.

Furthermore, compared to a top metal interconnection layer, the first metal interconnection layer to the fourth metal interconnection layer are inter-layer metal interconnection layers. A thickness of the inter-layer metal interconnection layer is not too large, so that it may be prevented that the first electric fuse 110 or the second electric fuse 120 cannot be fused due to a too large thickness of the metal interconnection layer.

Therefore, in some implementations, one of the first electric fuse 110 and the second electric fuse 120 is a first metal interconnection layer, and the other is a third metal interconnection layer, or one of the first electric fuse 110 and the second electric fuse 120 is a second metal interconnection layer, and the other is a fourth metal interconnection layer.

As an example, a metal interconnection layer corresponding to the first electric fuse 110 is located below a metal interconnection layer corresponding to the second electric fuse 120. In other embodiments and implementations, a metal interconnection layer corresponding to the first electric fuse is located above a metal interconnection layer corresponding to the second electric fuse.

Figure 3:
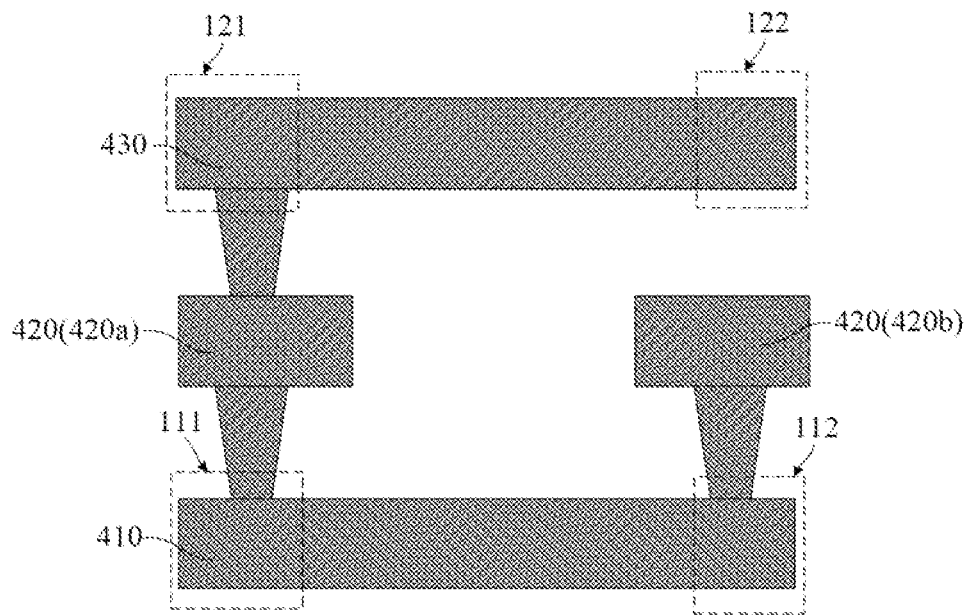
FIG. 3 is a schematic structural diagram of one form of a metal interconnection layer corresponding to a first electric fuse and a second electric fuse in FIG. 2.

With reference to FIG. 3, a schematic structural diagram of one form of metal interconnection layers corresponding to the first electric fuse 110 and the second electric fuse 120 is shown. As an example, a metal interconnection layer corresponding to the first electric fuse 110 is a first metal interconnection layer 410, and a metal interconnection layer corresponding to the second electric fuse 120 is a second metal interconnection layer 430.

A metal interconnection layer located between the first metal interconnection layer 410 and the third metal interconnection layer 430 is a second metal interconnection layer 420.

Projections of the first metal interconnection layer 410 and the second metal 420 are perpendicular to each other in the horizontal plane, projections of the third metal interconnection layer 430 and the second metal interconnection layer 420 are perpendicular to each other in the horizontal plane, and projections of the first metal interconnection layer 410 and the third metal interconnection layer 430 are parallel to each other in the horizontal plane.

There is a plurality of second metal interconnection layer 420. One of the second metal interconnection layer 420 (that is, the second metal interconnection layer 420a) is configured to be connected to the drain of the programming transistor 100, and the other second metal interconnection layer 420 (that is, the second metal interconnection layer 420b) is configured to be connected to the second terminal 112 of the first electric fuse 110.

The first programming bit line (BL) is connected to the second terminal 112 of the first electric fuse 110. When the first electric fuse 110 in the eFuse memory cell 50 is programmed, a first programming voltage is applied to the programming bit line (BL), so that a programming current flows through the first electric fuse 110. In particular, the second metal interconnection layer 420 (that is, the second metal interconnection layer 420b) connected to the second terminal 112 of the first electric fuse 110 is used as the first programming bit line (BL).

Similarly, the second programming bit line (BLR) is connected to the fourth terminal 122 of the second electric fuse 120. When the second electric fuse 120 in the eFuse memory cell 50 is programmed, a second programming voltage is applied to the second programming bit line (BLR), so that a programming current flows through the second electric fuse 120.

In particular, a fourth metal interconnection layer (not shown) connected to the second terminal 112 of the first electric fuse 110 is used as the second programming bit line (BLR).

In some implementations, the first programming bit line (BL) and the second programming bit line (BLR) are two independent programming bit lines, so as to control the corresponding first electric fuse 110 and second electric fuse 120, respectively.

Figure 4:
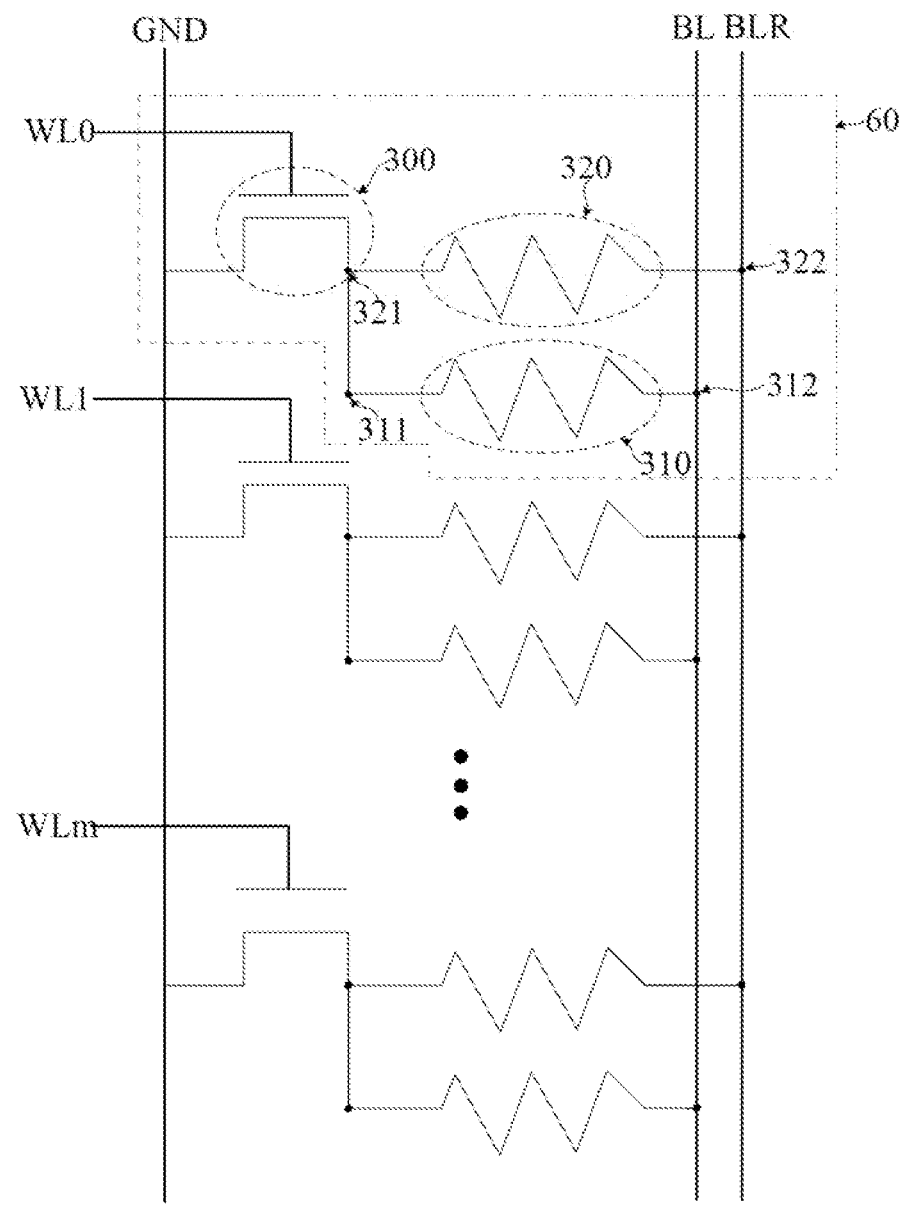
FIG. 4 is a schematic diagram of a circuit structure of one form of an eFuse memory array according to the present disclosure.

Correspondingly, the present disclosure further provides an eFuse memory array. Referring to FIG. 4, a schematic diagram of a circuit structure of one form of an eFuse memory array is shown.

The eFuse memory array includes: a plurality of eFuse memory cells 60 arranged in a matrix, where each of the eFuse memory cells 60 comprises a programming transistor 300, a first electric fuse 310, and one or more second electric fuses 320 connected in parallel, where a source of the programming transistor 300 is grounded (GND); the first electric fuse 310 having a first terminal 311 and a second terminal 312 that is opposite to the first terminal 311, where the first terminal 311 of the first electric fuse 310 is connected to a drain of the programming transistor 300; and the second electric fuse 320 is connected in parallel with the first electric fuse 310, and the second electric fuse 320 has a third terminal 321 and a fourth terminal 322 that is opposite to the third terminal 321, where the third terminal 321 of the second electric fuse 320 is connected to the drain of the programming transistor 300; a plurality of word lines (WL), where each of the word lines (WL) is correspondingly connected to a gate of the programming transistor 300 in a same row in the matrix; a plurality of first programming bit lines (BL), where each of the first programming bit lines (BL) is correspondingly connected to a second terminal 312 of the first electric fuse 310 in a same column in the matrix; and a plurality of second programming bit lines (BLR), where each of the second programming bit lines (BLR) is correspondingly connected to a fourth terminal 322 of the second electric fuse 320 in a same column in the matrix, and when there is a plurality of second electric fuses 320 in each of the eFuse memory cells 60, the second programming bit lines (BLR) being in a one-to-one correspondence with the second electric fuses 320.

In the eFuse memory array, each of the eFuse memory cell 60 includes a first electric fuse 310 and one or more second electric fuses 320 connected in parallel, the second electric fuse 320 being connected in parallel with the first electric fuse 310. Therefore, when each of the eFuse memory cell 60 is programmed, if the first electric fuse 310 fails to be programmed, the second electric fuse 320 may still be programmed, that is, each eFuse memory cell 60 has an opportunity to be programmed at least twice, thereby improving a yield rate of the eFuse memory cell 60 and correspondingly improving a yield rate of the eFuse memory array.

The programming transistor 100 is configured to generate a programming control signal for controlling an operation state of the eFuse memory cell 60 to control a programming state of the eFuse memory cell 60.

In particular, the programming transistor 300 is adapted to generate an input signal for controlling the eFuse memory cell 60 to get into the programming state. When a valid potential (valid high potential or low potential) is applied to the gate of the programming transistor 300, the programming transistor 300 is turned on.

Therefore, the programming transistor 300 is in a one-to-one correspondence with the eFuse memory cell 60, that is, in the eFuse memory array, a number of the programming transistor 300 is equal to a number of the eFuse memory cell 60.

In some implementations, the programming transistor 300 is an NMOS transistor. With a same size, compared to a PMOS transistor, a saturation current (Idsat) of the NMOS transistor is relatively large. Therefore, a larger programming current may be generated, to achieve fusing of the first electric fuse 310 or the second electric fuse 320, so that programming efficiency of the eFuse memory cell 60 is improved.

Correspondingly, when the high potential is applied to the gate of the programming transistor 300, the programming transistor 300 is turned on.

In some implementations, according to actual requirements, the programming transistor may also be a PMOS transistor. Correspondingly, when the low potential is applied to the gate of the programming transistor, the programming transistor is turned on. Correspondingly, in order to cause the programming transistor to be turned on, the source of the programming transistor is grounded.

The word lines (WL) are signal lines for controlling a programming operation. Each word line (WL) is correspondingly connected to the gate of the programming transistor 300 in a plurality of eFuse memory cells 60 in a same row in the matrix. Each word line (WL) is configured to control turn-on and turn-off of the programming transistor 300 in the eFuse memory cell 60 connected to the word line.

In particular, the eFuse memory array includes the plurality of eFuse memory cells 60 arranged in a matrix, and the word line (WL) is configured to determine a row address of a to-be-programmed eFuse memory cell 60 in the array, and is further configured to turn on the programming transistor 300 of the eFuse memory cell 60 corresponding to the address, so that the to-be-programmed eFuse bit cell 60 is programmed.

The eFuse memory array includes a plurality of independent word lines (WL). A number of the word lines (WL) corresponds to a number of rows of the eFuse memory cell 60. For example, if the eFuse memory array has m rows of eFuse memory cells 60, the eFuse memory array includes m+1 word lines (WL), such as WL0, WL1, . . . , WLm, respectively. Because the plurality of word lines (WL) are independent, control of the programming transistors 300 of different row addresses is also independent.

The first electric fuse 310 has a first terminal 311 and a second terminal 312 opposite to the first terminal 311. The first terminal 311 of the first electric fuse 310 is connected to a drain of the programming transistor 300.

In some implementations, the first terminal 311 and the second terminal 312 are two bonding pads of the first electric fuse 310. The first terminal 311 is an anode of the first electric fuse 310, and the second terminal 312 is a cathode of the first electric fuse 310. In the first electric fuse 310, a part between the first terminal 311 and the second terminal 312 is generally referred to as a fuse-link.

When the first electric fuse 310 gets into a programming state, a programming current flowing into the first electric fuse 310 through the programming transistor 300 destroys (that is, fuses) a fuse-link, thereby changing a resistance of the first electric fuse 310.

The second electric fuse 320 is connected in parallel with the first electric fuse 310, and the second electric fuse 320 is used as a redundant electric fuse of the first electric fuse 310.

In some implementations, materials, structures and sizes of the second electric fuse 320 and the first electric fuse 310 are the same.

The third terminal 321 of the second electric fuse 320 is connected to the drain of the programming transistor 300. Therefore, when the second electric fuse 320 is programmed, a programming current flows through the second electric fuse 320 and the programming transistor 300 in sequence to the ground at the source of the programming transistor 300.

As the number of the second electric fuses 320 connected in parallel is increasingly larger, the eFuse memory cell 60 has more opportunities to be programmed. However, when there is a plurality of second electric fuses 320, because the plurality of second electric fuses 320 are stacked, there are more second electric fuses 320, correspondingly causing an excessively large thickness of an eFuse IP (intellectual property) core. Accordingly, in one form, in each of the eFuse memory cells 60, there is one second electric fuses 320, that is, the eFuse memory cell 60 includes a first electric fuse 310 and a second electric fuse 320, to facilitate design of a peripheral circuit corresponding to the eFuse memory array, thereby preventing an excessively large thickness of the eFuseIP core.

For a description of the second electric fuse 320, reference may be made to a related description of the first electric fuse 310 described above, as the details are not described herein again.

In one form, materials of the first electric fuse 310 and the second electric fuse 320 are metal materials, that is, the first electric fuse 310 and the second electric fuse 320 are both metal electric fuses.

The metal electric fuse has a relatively low initial resistance. When the metal electric fuse is not programmed, a resistance value of the metal electric fuse is very small, for example, 5Ω to 200Ω. When a relatively large programming current flows through the metal electric fuse and causes the metal electric fuse to be fused, the resistance value of the metal electric fuse doubles, for example, 1 KΩ to 100 KΩ. In the eFuse memory array, the fused metal electric fuse is permanently in a turned-off state, while an unfused metal electric fuse remains in a turned-on state.

Therefore, data stored in the eFuse memory array is known by determining whether the metal electric fuse is fused. Generally, a read circuit commonly used in the field of electrical memory may be used to read a state of the metal electric fuse (that is, whether the metal electric fuse is programmed or not).

In addition, through the metal electric fuse, the first electric fuse 310 and the second electric fuse 320 may be formed using a back end of line (BEOL) manufacturing procedure, and the first electric fuse 310 and the second electric fuse 320 are easily in a stacked state, helping to prevent a too large planar size of the eFuse memory cell 60. For example, compared to an eFuse memory cell having a single electric fuse, a size of the eFuse memory cell 60 in some implementations remains unchanged in the horizontal plane, so that an area of the eFuse memory array remains unchanged in the chip.

In addition, a metal electric fuse is selected to improve compatibility of a process of forming the metal electric fuse with CMOS manufacturing processes, without either an additional process step or process costs.

In particular, the metal material is copper. An initial resistance value of copper is very small, and selection of copper causes the process of forming the metal electric fuse to be compatible with the back end of line manufacturing procedure.

In some implementations, the first electric fuse 310 and the second electric fuse 320 are two layers of metal isolated along a stacking direction, so that the first electric fuse 310 and the second electric fuse 320 are connected in parallel. Simultaneously, in the case that it is guaranteed that each eFuse memory cell 60 is programmed twice, a size of the eFuse memory cell 60 remains unchanged in the horizontal plane, so that an area of the eFuse memory array remains unchanged in the chip.

In some implementations, projections of the two metal interconnection layers in the horizontal plane are parallel to each other.

The first electric fuse 310 and the second electric fuse 320 are two metal interconnection layers isolated along a stacking direction, that is, the first electric fuse 310 and the second electric fuse 320 are different metal interconnection layers. Therefore, when projections of the two metal interconnection layers in the horizontal plane are parallel to each other, the first terminal 311 of the first electric fuse 310 and the third terminal 321 of the second electric fuse 320 are both easily connected to a drain of the programming transistor 300, reducing complexity of circuit design and preventing the size of the eFuse memory cell 60 in the horizontal plane from being increased.

In circuit design, projections of two adjacent metal interconnection layers in the horizontal plane intersect with each other perpendicularly, while projections of odd metal interconnection layers in the horizontal plane are parallel to each other, and projections of even metal interconnection layers in the horizontal plane are also parallel to each other. Therefore, in some implementations, the metal interconnection layers corresponding to the first electric fuse 310 and the metal interconnection layers corresponding to the second electric fuse 320 are both odd metal interconnection layers or are both even metal interconnection layers.

In some implementations, either of the first electric fuse 310 and the second electric fuse 320 is one of a first metal interconnection layer to a fourth metal interconnection layer.

In a back end of line (BEOL) manufacturing procedure, a metal interconnection structure generally includes a plurality of stacked metal interconnection layers. Either of the first electric fuse 310 and the second electric fuse 320 is one of the first metal interconnection layer to the fourth metal interconnection layer, to facilitate design of the peripheral circuit corresponding to the eFuse memory array. For example, other metal interconnection layers located above the fourth metal interconnection layer are used to design the peripheral circuit, preventing an excessively large thickness of the eFuse IP (intellectual property) core.

In addition, the first metal interconnection layer to the fourth metal interconnection layer are inter-layer metal interconnection layers, and forming processes of the first metal interconnection layer to the fourth metal interconnection layer are the same, so that a process difficulty in manufacturing the semiconductor is reduced.

Furthermore, compared to a top metal interconnection layer, the first metal interconnection layer to the fourth metal interconnection layer are inter-layer metal interconnection layers. A thickness of the inter-layer metal interconnection layer is not too large, so that it may be prevented that the first electric fuse 310 or the second electric fuse 320 cannot be fused due to a too large thickness of the metal interconnection layer.

Therefore, in some implementations, one of the first electric fuse 310 and the second electric fuse 320 is a first metal interconnection layer, and the other is a third metal interconnection layer, or one of the first electric fuse 310 and the second electric fuse 320 is a second metal interconnection layer, and the other is a fourth metal interconnection layer.

As an example, a metal interconnection layer corresponding to the first electric fuse 310 is located below a metal interconnection layer corresponding to the second electric fuse 320. In other embodiments and implementations, a metal interconnection layer corresponding to the first electric fuse is located above a metal interconnection layer corresponding to the second electric fuse.

Each of the first programming bit lines (BL) is correspondingly connected to the second terminal 312 of the first electric fuse 310 in the plurality of eFuse memory cells 60 in a same column in the matrix. When the first electric fuse 310 in the eFuse memory cell 60 is programmed, a first programming voltage is applied to the first programming bit line (BL), so that a programming current flows through the first electric fuse 310.

In particular, the eFuse memory array includes the plurality of eFuse memory cells 60 arranged in a matrix. The first programming bit line (BL) is configured to determine a column address of a to-be-programmed eFuse memory cell 60 in the array, so that the to-be-programmed eFuse memory cell 60 is programmed.

The eFuse memory array includes a plurality of independent first programming bit lines (BL). A number of the first programming bit lines (BL) corresponds to a number of columns of the eFuse memory cells 60. For example, the eFuse memory array has n columns of eFuse memory cells 60, and therefore the eFuse memory array includes n first programming bit lines (BL). Each column of the first programming bit lines (BL) is connected to a second terminal 312 of a first electric fuse 310 in the plurality of eFuse memory cells 60 in the column. Because the plurality of first programming bit lines (BL) are independent, control of the first electric fuses 310 in different column addresses is also independent.

Similarly, each of the second programming bit lines (BLR) is correspondingly connected to a fourth terminal 322 of a second electric fuse 320 in the plurality of eFuse memory cells 60 in a same column in the matrix. When there is a plurality of second electric fuses 320 in each of the eFuse memory cells 60, the second programming bit lines (BLR) are in a one-to-one correspondence with the second electric fuses. When the second electric fuse 320 in the eFuse memory cell 60 is programmed, a second programming voltage is applied to the second programming bit line (BLR), so that a programming current flows through the corresponding second electric fuse 320.

In some implementations, there is one second electric fuse 320 in each of the eFuse memory cells 60. Therefore, the eFuse memory array includes a plurality of independent second programming bit lines (BLR). A number of the second programming bit lines (BLR) corresponds to a number of columns of the eFuse memory cell 60. For example, if the eFuse memory array has n columns of eFuse memory cells 60, the eFuse memory array includes n second programming bit lines (BLR). Each column of the second programming bit lines (BLR) is connected to a second terminal 322 of a second electric fuse 320 in the plurality of eFuse memory cells 60 in the column. Because the plurality of second programming bit lines (BLR) are independent, control of the second electric fuses 320 in different column addresses is also independent.

In addition, in one form, in each column of the plurality of eFuse memory cells 60, the first programming bit line (BL) and the second programming bit line (BLR) are two independent programming bit lines, so as to control the corresponding first electric fuse 310 and second electric fuse 320, respectively.

Figure 5:
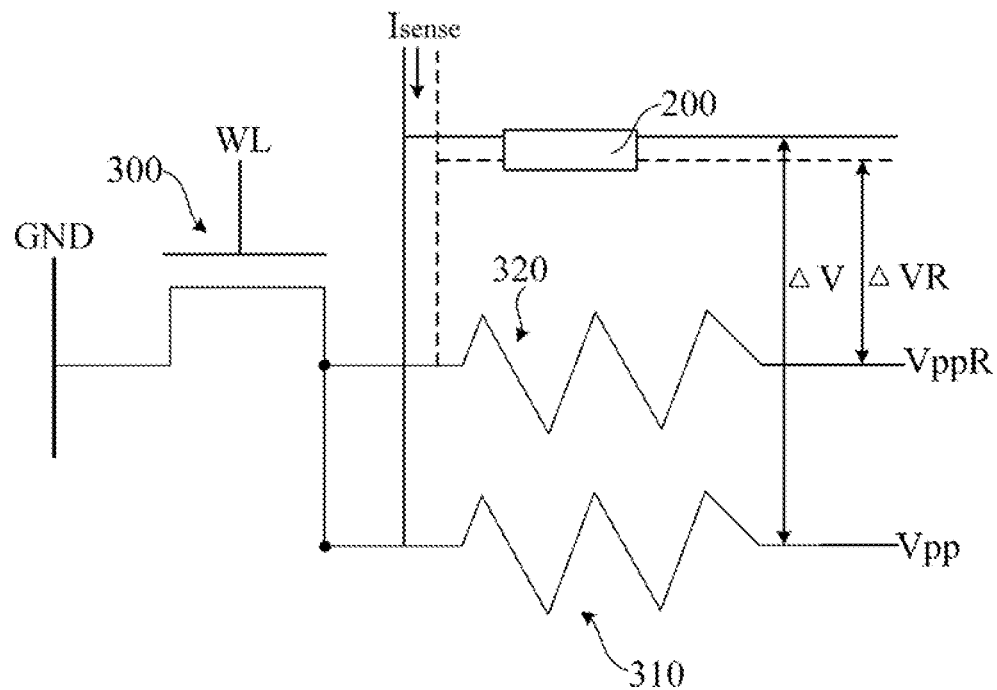
FIG. 5 is a schematic diagram of one form of a using method of an eFuse memory array according to the present disclosure.

The present disclosure further provides a method for use of the foregoing eFuse memory array. Referring to FIG. 5, a schematic diagram of one form of a method for utilizing an eFuse memory array is shown.

For ease of illustration, one eFuse memory cell in the eFuse memory array is only illustrated in some implementations.

Referring to FIG. 5, the using method of the eFuse memory array includes: a turn-on voltage is applied to any of the plurality of word lines (WL) to turn on a programming transistor 300; and a first programming voltage Vpp is applied to a first programming bit line (BL) corresponding to any of the eFuse memory cells 60 (shown in FIG. 4).

In some implementations, the programming transistor 300 is an NMOS transistor. Therefore, the word line (WL) is connected to a high level, so that the programming transistor 300 is turned on.

Each word line (WL) is correspondingly connected to a gate of the programming transistor 300 in a plurality of eFuse memory cells 60 in a same row in the matrix. Therefore, after any word line (WL) is connected to a high level, programming transistors 300 sharing a same word line (WL) in the eFuse memory array are turned on.

The first programming bit line (BL) is configured to determine a column address of a to-be-programmed eFuse memory cell 60 in the array, so that the first programming voltage Vpp is applied to the first electric fuses 310 sharing the same first programming bit line (BL) in the eFuse memory array.

Therefore, a specific address of the to-be-programmed eFuse memory cell 60 in the array is determined through the word line (WL) and the first programming bit line (BL), so that the first electric fuse 310 in the selected eFuse memory cell 60 is programmed, and the second electric fuse 320 in an unselected eFuse memory cell 60 and a remaining eFuse memory cell 60 are in a non-programmed state.

In a programming operation, the programming transistor 300 is turned on, and the first programming voltage Vpp is applied to the first programming bit line (BL). A programming current starts to flow from a second terminal 312 of the first electric fuse 310 through the first electric fuse 310 and the programming transistor 300 to a ground at a source of the programming transistor 300. Therefore, after the first electric fuse 310 is successfully programmed, the first electric fuse 310 has a high resistance value.

Still referring to FIG. 5, the method for utilizing the eFuse memory array further includes: after the turn-on voltage is applied to any of the plurality of word lines (WL), and the first programming voltage is applied to the first programming bit line (BL) corresponding to any of the eFuse memory cells 60, it is determined whether the first electric fuse 310 is programmed.

The determining whether the first electric fuse 310 is programmed is to determine whether the first electric fuse 310 is fused.

As an example, the eFuse memory array is integrated in an eFuse system. The eFuse system mainly includes the eFuse memory array and a peripheral circuit, and a reference resistor 200 is disposed in the peripheral circuit for implementing a read operation.

In the read operation, the programming transistor 300 is turned off. Therefore, the programming transistor 300 is disconnected from the first electric fuse 310. A read current Isense flows through the reference resistor 200 and the first electric fuse 310 simultaneously, and generates voltage drops, respectively. Therefore, there is a voltage difference ΔV between the reference resistor 200 and the first electric fuse 310.

If the first electric fuse 310 is successfully programmed (that is, the first electric fuse 310 is fused), a high impedance state of the first electric fuse 310 causes a larger voltage drop corresponding to the first electric fuse 310.

Therefore, it is determined whether the voltage difference ΔV is greater than or equal to a voltage difference threshold, so that it is determined whether the first electric fuse 310 is programmed.

When the voltage difference ΔV is greater than or equal to the voltage difference threshold, it is indicated that the first electric fuse 310 is successfully programmed, that is, programming of the corresponding eFuse memory cell 60 is completed.

When the voltage difference ΔV is less than the voltage difference threshold, it is indicated that the first electric fuse 310 is not programmed.

Therefore, still referring to FIG. 5, when the first electric fuse 310 is not programmed, the using method of the eFuse memory array further includes: a second programming voltage VppR is sequentially applied to a second programming bit line (BLR) in the same eFuse memory cell 60; and after the second programming voltage VppR is applied to the second programming bit line (BLR), it is determined whether the corresponding second electric fuse 320 is programmed.

Similarly, in a read operation, the read current Isense flows through the reference resistor 200 and the second electric fuse 320 simultaneously, and generates voltage drops, respectively. Therefore, there is a voltage difference ΔVR between the reference resistor 200 and the second electric fuse 320.

If the second electric fuse 320 is successfully programmed (that is, the second electric fuse 320 is fused), a high impedance state of the second electric fuse 320 causes a larger voltage drop corresponding to the second electric fuse 320.

Therefore, it is determined whether the voltage difference ΔVR is greater than or equal to a voltage difference threshold, so that it is determined whether the second electric fuse 320 is programmed.

When the voltage difference ΔVR is greater than or equal to the voltage difference threshold, it is indicated that the second electric fuse 320 is successfully programmed, that is, programming of the corresponding eFuse memory cell 60 is completed. When the voltage difference ΔVR is less than the voltage difference threshold, it is indicated that the second electric fuse 320 is not programmed.

In some implementations, each eFuse memory cell 60 has a second electric fuse 320. Therefore, each eFuse memory cell 60 has an opportunity to be programmed twice, thereby improving a yield rate of the eFuse memory cell.

It should be noted that, in other embodiments and implementations, when each eFuse memory cell has a plurality of second electric fuses connected in parallel, the second programming bit lines corresponding to the same eFuse memory cell are sequentially programmed, until one of the second electric fuses is not programmed. Correspondingly, each eFuse memory cell has an opportunity to be programmed more than twice.

It should be further noted that, for a description of the programming of the second electric fuse 320, reference may be made to a related description of the first electric fuse 310 described above, as the details are not described herein again.

Figure 6:
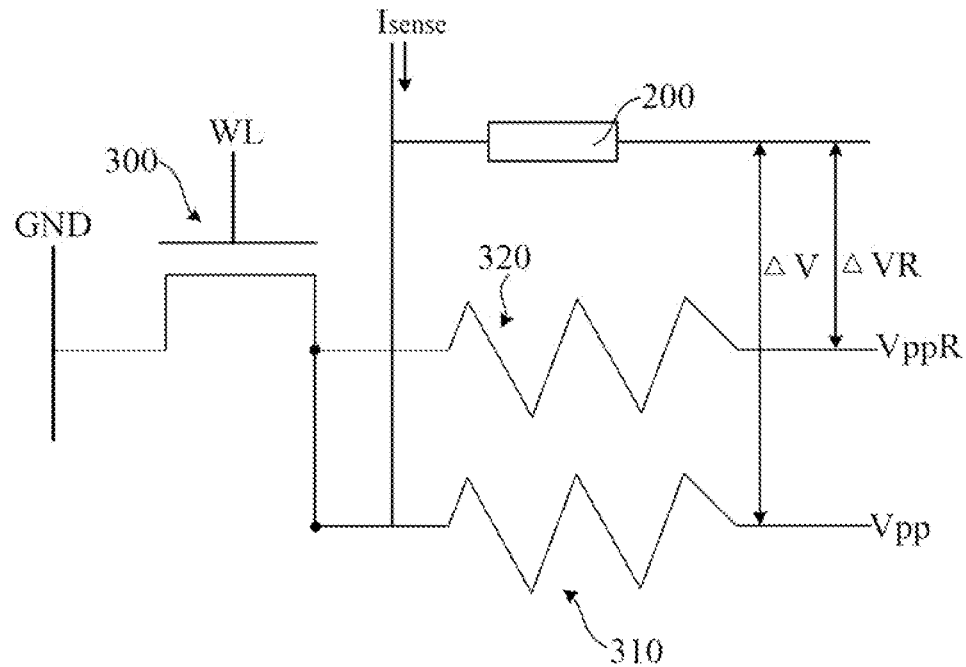
FIG. 6 is a schematic diagram of another embodiment of a using method of an eFuse memory array according to the present disclosure.

The present disclosure further provides a method for utilizing the foregoing eFuse memory array. Referring to FIG. 6, a schematic diagram of another form of a method for utilizing an eFuse memory array is shown.

Similarities between implementations described above and the implementations described below are not described herein again. One difference between implementations described below and the foregoing implementations is that: a programming operation and a read operation are performed on the first electric fuse 310 and the second electric fuse 320 in any of the eFuse memory cells 60 (as shown in FIG. 4), thereby improving use efficiency of an eFuse memory array.

In particular, referring to FIG. 6, a method for utilizing the eFuse memory array includes: a turn-on voltage is applied to any of the plurality of word lines (WL) to turn on a programming transistor 300; and a first programming voltage Vpp and a second programming voltage VppR are simultaneously applied to a first programming bit line (BL) and a second programming bit line (BLR) corresponding to any of the eFuse memory cells 60, respectively.

A turn-on voltage is applied to any of the plurality of word lines (WL), and the first programming voltage Vpp and the second programming voltage VppR are simultaneously applied to the first programming bit line (BL) and the second programming bit line (BLR) corresponding to any of the eFuse memory cells 60, respectively, so that the first electric fuse 310 and the second electric fuse 320 are programmed simultaneously.

For a detailed description of the programming operation, reference may be made to the corresponding description in the implementations described above, as the details are not described herein again.

Still referring to FIG. 6, the using method of the eFuse memory array further includes: after the turn-on voltage is applied to any of the plurality of word lines (WL), and the first programming voltage Vpp and the second programming voltage VppR are simultaneously applied to the first programming bit line (BL) and the second programming bit line (BLR) corresponding to any of the eFuse memory cells 60, respectively, the first electric fuse 310 and the second electric fuse 320 are read simultaneously, to simultaneously determine whether the first electric fuse 310 and the second electric fuse 320 are programmed.

In a read operation, a read current Isense flows through the reference resistor 200, the second electric fuse 320, and the first electric fuse 310 simultaneously, and generates voltage drops, respectively. Therefore, there is a voltage difference ΔV between the reference resistor 200 and the first electric fuse 310, and there is a voltage difference ΔVR between the reference resistor 200 and the second electric fuse 320.

Provided that it is detected that either of the voltage difference ΔV and the voltage difference ΔVR is greater than or equal to a voltage difference threshold, it may be indicated that programming of the corresponding eFuse memory cell 60 is completed.

When the voltage difference ΔV and the voltage difference ΔVR are both smaller than the voltage difference threshold, it is indicated that the corresponding eFuse memory cell 60 is not programmed.

The present disclosure further provides an eFuse system. The eFuse system includes the eFuse memory array according to the embodiments and implementations of the present disclosure.

The eFuse memory array includes a plurality of eFuse memory cells arranged in a matrix. Each eFuse memory cell has an opportunity to be programmed at least twice, thereby improving a yield rate of the eFuse memory cell, and correspondingly improving a yield rate of the eFuse system.

The eFuse system further includes a peripheral circuit configured to implement a programming operation or a read operation on the eFuse memory cell.

Although the present disclosure is disclosed as above, the present disclosure is not limited thereto. A person skilled in the art may make variations and modifications without departing from the spirit and scope of the present disclosure. Therefore, the protection scope of the present disclosure should be subject to the claims.

What is claimed is:

1. An electrically programmable fuse (eFuse) memory cell, comprising:
   a programming transistor, where a source of the programming transistor is grounded;
   a first electric fuse having a first terminal and a second terminal opposite to the first terminal, where the first terminal of the first electric fuse is connected to a drain of the programming transistor;
   a second electric fuse connected in parallel with the first electric fuse, the second electric fuse having a third terminal and a fourth terminal opposite to the third terminal, where the third terminal of the second electric fuse is connected to the drain of the programming transistor;
   a word line connected to a gate of the programming transistor;
   a first programming bit line connected to the second terminal of the first electric fuse; and
   a second programming bit line in a one-to-one correspondence with the second electric fuse, where the second programming bit line is connected to the fourth terminal of the second electric fuse.

2. The eFuse memory cell according to claim 1, wherein the programming transistor is an NMOS transistor.

3. The eFuse memory cell according to claim 1, wherein materials of the first electric fuse and the second electric fuse are both metal materials.

4. The eFuse memory cell according to claim 1, wherein the eFuse does not include more than one second electric fuse.

5. The eFuse memory cell according to claim 1, wherein the first electric fuse and the second electric fuse are two metal interconnection layers isolated along a stacking direction.

6. The eFuse memory cell according to claim 5, wherein projections of the two metal interconnection layers are parallel to each other in a horizontal plane.

7. The eFuse memory cell according to claim 6, wherein:
   either of the first electric fuse and the second electric fuse is a first metal interconnection layer, and the other is a third metal interconnection layer; or
   either of the first electric fuse and the second electric fuse is a second metal interconnection layer, and the other is a fourth metal interconnection layer.

8. The eFuse memory cell according to claim 5, wherein either of the first electric fuse or the second electric fuse is one of a first metal interconnection layer to a fourth metal interconnection layer.

9. An electrically programmable fuse (eFuse) memory array, comprising:
   a plurality of eFuse memory cells arranged in a matrix, wherein each of the eFuse memory cells comprises:
      a programming transistor, where a source of the programming transistor is grounded,
      a first electric fuse, and
      one or more second electric fuses connected in parallel;
      where the first electric fuse has a first terminal and a second terminal opposite to the first terminal, the first terminal of the first electric fuse being connected to a drain of the programming transistor, and where each of the second electric fuses is connected in parallel with the first electric fuse; and
      where each of the second electric fuses has a third terminal and a fourth terminal opposite to the third terminal, and where the third terminal of each of the second electric fuses is connected to a drain of the programming transistor;
   a plurality of word lines, where each of the word lines is correspondingly connected to a gate of the programming transistor in a same row in the matrix;
   a plurality of first programming bit lines, where each of the first programming bit lines is correspondingly connected to a second terminal of the first electric fuse in a same column in the matrix; and
   a plurality of second programming bit lines, each of the second programming bit lines is correspondingly connected to a fourth terminal of the second electric fuse in a same column in the matrix, and when there is a plurality of second electric fuses in each of the eFuse memory cells, the second programming bit lines being in a one-to-one correspondence with the second electric fuses.

10. The eFuse memory array according to claim 9, wherein the programming transistor is an NMOS transistor.

11. The eFuse memory array according to claim 9, wherein materials of the first electric fuse and the one or more second electric fuses are metal materials.

12. The eFuse memory array according to claim 9, wherein there is one second electric fuse in each of the eFuse memory cells.

13. The eFuse memory array according to claim 12, wherein the first electric fuse and the second electric fuse are two metal interconnection layers isolated along a stacking direction.

14. The eFuse memory array according to claim 13, wherein projections of the two metal interconnection layers in a horizontal plane are parallel to each other.

15. The eFuse memory array according to claim 14, wherein either of the first electric fuse and the second electric fuse is a first metal interconnection layer, and the other is a third metal interconnection layer; or
   either of the first electric fuse and the second electric fuse is a second metal interconnection layer, and the other is a fourth metal interconnection layer.

16. The eFuse memory array according to claim 13, wherein either of the first electric fuse and the second electric fuse is one of a first metal interconnection layer to a fourth metal interconnection layer.

17. A using method of the eFuse memory array according to claim 9, comprising:
- applying a turn-on voltage to any of the plurality of word lines to turn on the programming transistor;
- applying a first programming voltage to the first programming bit line corresponding to any of the eFuse memory cells;
- after the turn-on voltage is applied to any of the plurality of word lines, and the first programming voltage is applied to the first programming bit line corresponding to any of the eFuse memory cells:
  - determining whether the first electric fuse is programmed;
  - when the first electric fuse is programmed, completing a programming operation on the corresponding eFuse memory cell; and
  - when the first electric fuse is not programmed, sequentially applying a second programming voltage to the second programming bit lines corresponding to a same eFuse memory cell; and
- after the second programming voltage is applied to the second programming bit lines corresponding to the same eFuse memory cell, determining whether the corresponding second electric fuse is programmed.

18. A using method of the eFuse memory array according to claim 9, comprising:
- applying a turn-on voltage to any of the plurality of word lines to turn on the programming transistor;
- simultaneously applying a second programming voltage and a first programming voltage to the first programming bit line and the second programming bit line corresponding to any of the eFuse memory cells, respectively;
- after the turn-on voltage is applied to any of the plurality of word lines, and the second programming voltage and the first programming voltage are simultaneously applied to the first programming bit line and the second programming bit line corresponding to any of the eFuse memory cells, respectively, simultaneously determining whether the first electric fuse and the second electric fuse are programmed; and
- when at least one of the first electric fuse and the second electric fuse is programmed, completing a programming operation on the corresponding eFuse memory cell.

19. An eFuse system, comprising the eFuse memory array according to claim 9.

* * * * *